United States Patent
Takanami et al.

(10) Patent No.: US 10,356,970 B2
(45) Date of Patent: Jul. 16, 2019

(54) FEEDER EXCHANGING CARRIAGE

(71) Applicant: Panasonic Intellectual Property Management Co., Ltd., Osaka (JP)

(72) Inventors: Yasuo Takanami, Yamanashi (JP); Chikara Takata, Yamanashi (JP); Yasuo Oku, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 85 days.

(21) Appl. No.: 15/352,753

(22) Filed: Nov. 16, 2016

(65) Prior Publication Data
US 2017/0245407 A1 Aug. 24, 2017

(30) Foreign Application Priority Data

Feb. 23, 2016 (JP) .................................. 2016-031543
Feb. 23, 2016 (JP) .................................. 2016-031544

(51) Int. Cl.
*H05K 13/04* (2006.01)
*B65H 75/42* (2006.01)
*B65H 75/40* (2006.01)

(52) U.S. Cl.
CPC ......... *H05K 13/0417* (2013.01); *B65H 75/40* (2013.01); *B65H 75/403* (2013.01); *B65H 75/42* (2013.01)

(58) Field of Classification Search
CPC . B65H 5/04; B65H 5/28; B65H 27/00; B65H 29/006; B65H 75/403; B65H 75/40;
(Continued)

(56) References Cited

U.S. PATENT DOCUMENTS

| 6,273,666 | B1* | 8/2001 | Barnowski | H05K 13/021 269/17 |
| 6,536,796 | B1* | 3/2003 | Solomon | B62B 3/02 280/47.34 |
| 7,066,704 | B2* | 6/2006 | Endo | H05K 13/021 254/2 C |
| 8,999,108 | B2* | 4/2015 | Nagao | H05K 13/0417 156/714 |

(Continued)

FOREIGN PATENT DOCUMENTS

| JP | S62-166157 A | 7/1987 |
| JP | 2008-021693 A | 1/2008 |

(Continued)

*Primary Examiner* — Michael R Mansen
*Assistant Examiner* — Raveen J Dias
(74) *Attorney, Agent, or Firm* — Pearne & Gordon LLP

(57) ABSTRACT

A feeder exchanging carriage includes a reel holder which holds a reel on which a carrier tape which stores electronic components is wound, a feeder holder which holds a tape feeder which performs a feeding operation of the carrier tape, and a base unit which is provided with a pair of front wheels and a pair of rear wheels, and a telescopic unit (a front base and a rear base) which expands and contracts an interval between the pair of front wheels and the pair of rear wheels. In a state where the feeder exchanging carriage is mounted to an electronic component mounter, the interval between the front and rear wheels is contracted by the telescopic unit, and in a state where the feeder exchanging carriage is not mounted to an electronic component mounter, the interval between the front and rear wheels is expanded by the telescopic unit.

6 Claims, 7 Drawing Sheets

(58) Field of Classification Search
CPC ........ B65H 54/26; B65H 67/02; B65H 67/04;
B65H 75/42; B65H 75/4497; B65H
2301/42264; B65H 2301/42265; B65H
2402/42; B62B 1/00; B62B 3/00; B62B
5/00; B62B 7/00; B62B 9/00; B62B
2301/10; B62B 2206/02; B62B 2205/145;
B62B 3/02; B62B 2206/00; B62B
2206/03; B62B 2206/06; H05K 13/00;
H05K 1/00; H05K 3/00; H05K 13/003;
H05K 13/02; H05K 13/04; H05K
13/0417; H05K 13/046; H05K 13/0478
USPC .... 242/560.2, 567; 280/828, 5.5, 6.15, 7.15,
280/845
See application file for complete search history.

(56) References Cited

U.S. PATENT DOCUMENTS

| | | | | |
|---|---|---|---|---|
| 2009/0065149 | A1* | 3/2009 | Yamasaki | ............. B26D 1/085 |
| | | | | 156/353 |
| 2009/0074550 | A1* | 3/2009 | Yamasaki | .......... H05K 13/0452 |
| | | | | 414/595 |
| 2014/0346756 | A1* | 11/2014 | Laffan | ....................... B62B 9/26 |
| | | | | 280/648 |

FOREIGN PATENT DOCUMENTS

| | | | | |
|---|---|---|---|---|
| JP | 2008103592 | A * | 5/2008 | |
| JP | 2008-141083 | A | 6/2008 | |
| WO | WO-2016142987 | A1 * | 9/2016 | ............. H05K 13/02 |

\* cited by examiner

FEEDER EXCHANGING CARRIAGE

BACKGROUND

1. Technical Field

The present disclosure relates to a feeder exchanging carriage, on which a plurality of tape feeders are mounted, which supplies the tape feeders to an electronic component mounter such that the tape feeders may be attached to or detached from the electronic component mounter.

2. Description of the Related Art

Tape feeders for feeding a carrier tape in which electronic components are stored to supply the electronic components are widely used as electronic component suppliers for supplying electronic component to electronic component mounters. In the electronic component mounter, when the mounting conditions are changed, such as the type of board which serves as the mounting target being changed, the tape feeder is exchanged for a tape feeder which supplies the corresponding electronic components. A system is known in which tape feeders are exchanged in a batch by attaching and detaching a feeder exchanging carriage, in which the plurality of tape feeders are lined up and mounted on the feeder exchanging carriage, in relation to an electronic component mounter in order to shorten the exchanging time of the tape feeders (for example, PTL 1).

The feeder exchanging carriage also holds reels on which carrier tape supplied by the tape feeder is wound, is provided with wheels on the bottom, and carts freely. Accordingly, attachment and detachment in relation to the electronic component mounter is easy, and movement in a state of being removed from the electronic component mounter is easy. The exchanging of the tape feeders using such a feeder exchanging carriage is performed by removing the feeder exchanging carriage which is already mounted to the electronic component mounter, and carrying a feeder exchanging carriage on which tape feeders corresponding to the production of the next board which are prepared in advance are mounted to the electronic component mounter, and mounting the feeder exchanging carriage.

CITATION LIST

Patent Literature

PTL1: Japanese Patent Unexamined Publication No. 2008-21693

SUMMARY

A feeder exchanging carriage of the disclosure includes a reel holder which holds a reel on which a carrier tape which stores electronic components is wound, a feeder holder which holds a tape feeder which performs a feeding operation of the carrier tape, and a base unit provided with a pair of front wheels, a pair of rear wheels, and a telescopic unit which is capable of expanding and contracting an interval between the pair of front wheels and the pair of rear wheels, in which in a state in which the feeder exchanging carriage is mounted to an electronic component mounter, the interval is contracted by the telescopic unit, and in which in a state in which the feeder exchanging carriage is not mounted to an electronic component mounter, the interval is expanded by the telescopic unit.

A feeder exchanging carriage of the disclosure includes a reel holder which holds a reel on which a carrier tape which stores electronic components is wound, a feeder holder which holds a tape feeder which performs a feeding operation of the carrier tape, a base unit provided with a pair of front wheels, a pair of rear wheels, and a telescopic unit which is capable of expanding and contracting an interval between the pair of front wheels and the pair of rear wheels, and a sliding lock unit which suppresses the contraction of the telescopic unit, in which in a state in which the feeder exchanging carriage is mounted to an electronic component mounter, the interval is contracted by the telescopic unit, and in which in a state in which the feeder exchanging carriage is not mounted to an electronic component mounter, the interval is expanded by the telescopic unit and the contraction of the interval is suppressed by the sliding lock unit.

According to the disclosure, it is possible to realize a feeder exchanging carriage capable of moving stably with excellent installation area efficiency.

BRIEF DESCRIPTION OF THE DRAWINGS

FIG. 4A illustrates one process and FIG. 4B illustrates the next process;

FIG. 5A illustrates one process and FIG. 5B illustrates the next process;

FIG. 6A illustrates one process and FIG. 6B illustrates the next process; FIG. 7A illustrates one process and FIG. 7B illustrates the next process.

DETAILED DESCRIPTION

Figure 1:
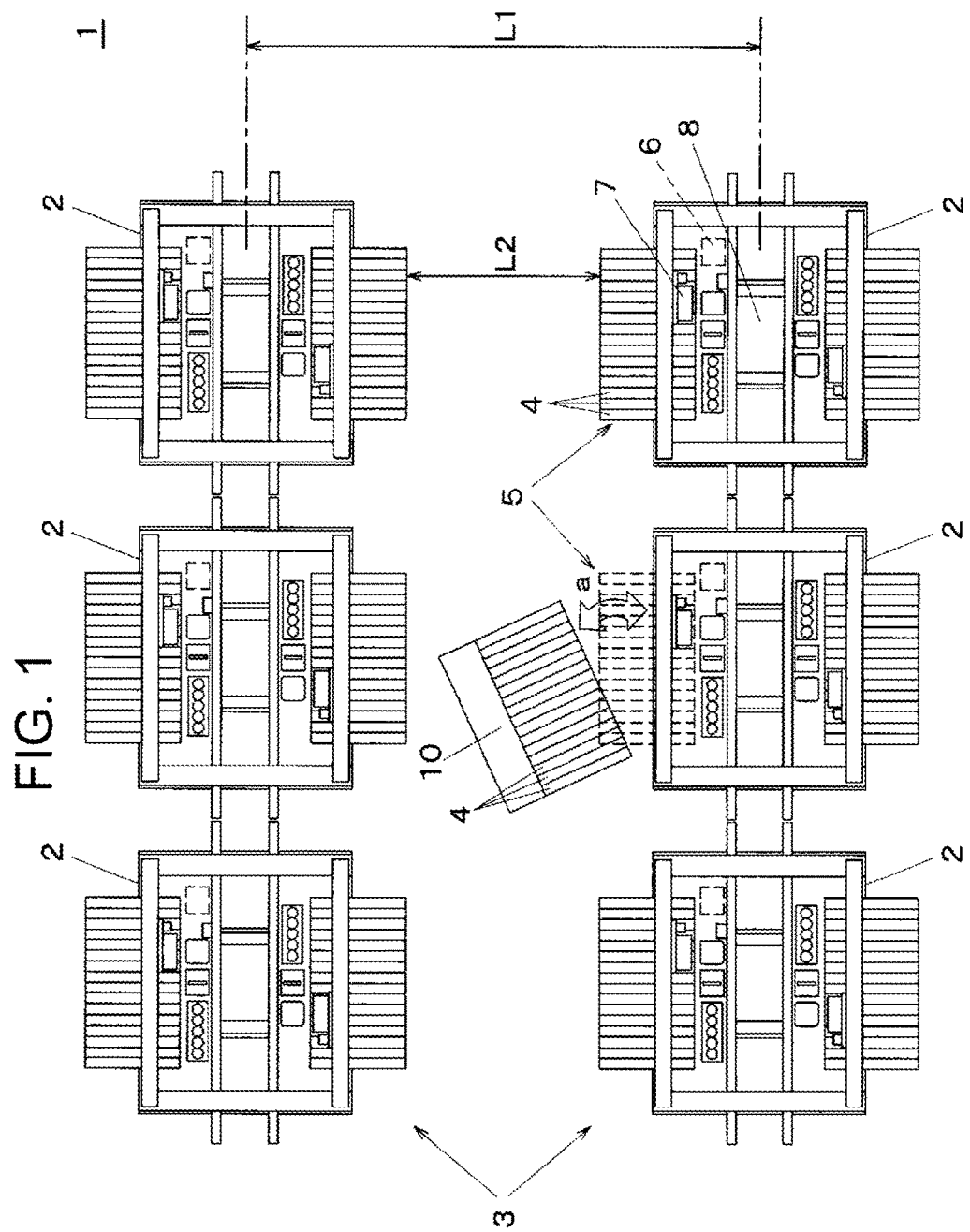
FIG. 1 is a diagram of the arrangement of a production line of an exemplary embodiment of the disclosure.

Before describing the embodiment of the present disclosure, a concise description will be given of the problems in the related art.

There is demand for a reduction in the size of the electronic component mounter (a shrinking of installation area) in order to improve the factory floor productivity (the number of electronic component mounters installed per unit floor area). In order to shrink the length (the length in the tape feeding direction in a state in which the tape feeders are mounted) of the electronic component mounter, it is necessary to shrink the length (the tape feeding direction) of the tape feeder and to shrink the depth (the length in the tape feeding direction in a state in which the tape feeders are mounted) of the feeder exchanging carriage on which the tape feeders are mounted.

Conversely, it is necessary to render the height at which the tape feeders are mounted to the electronic component mounter the same as in old devices in order to maintain compatibility. Accordingly, the following problem arises. In other words, the position (the height) of the center of gravity of the feeder exchanging carriage to which the tape feeders are mounted is determined by the height at which the tape feeders, which are heavy goods, are mounted. Meanwhile, when the depth of the feeder exchanging carriage is shrunk, the supporting base area which is determined by the positions of the wheels which support the feeder exchanging carriage is shrunk. Therefore, there is a problem in that the feeder exchanging carriage which is removed from the electronic component mounter is unstable and falls over easily.

Therefore, an object of the disclosure is to provide a feeder exchanging carriage capable of moving stably with excellent installation area efficiency.

Hereinafter, detailed description will be given of an exemplary embodiment of the present disclosure using the drawings. The configurations, forms, and the like described hereinafter are examples to facilitate explanation, and may be modified, as appropriate, according to the design of the electronic component mounter and the feeder exchanging carriage. Hereinafter, elements corresponding to each other are given the same symbols in all of the drawings, and duplicated description is omitted.

First, description will be given of production line 1 which produces mounted boards in which electronic components are mounted on boards, with reference to FIG. 1. Production line 1 is configured by disposing two rows of mounting lines 3, each of which is configured by linking a plurality of electronic component mounters 2. Electronic component mounter 2 is provided with tape feeder mounter 5 which on which tape feeders 4 are mounted to attach and detach freely, and a plurality of tape feeders 4 which are mounted to feeder exchanging carriage 10 are configured to be attachable and detachable in a batch.

The elements of electronic component mounter 2 are controlled by a device controller 6 which is embedded in electronic component mounter 2, and the electronic components which are sequentially supplied from tape feeders 4 which are mounted to tape feeder mounter 5 are picked up by mounting head 7 and are placed on board 8. In each mounting line 3, the same board 8 is transported from upstream to downstream, and various electronic components are sequentially mounted thereon in electronic component mounters 2 which are disposed in succession.

In FIG. 1, inter-row distance L1 between the two rows of mounting lines 3 is determined by the size of electronic component mounter 2 in the direction of inter-row distance L1, and distance L2 between tape feeders 4 which are mounted to electronic component mounters 2 of adjacent mounting lines 3. Distance L2 is set with a view to securing a working space for an operator who performs operations of electronic component mounters 2 between adjacent mounting lines 3, and a space for the operator to operate feeder exchanging carriage 10 to attach or detach (arrow a) tape feeders 4 in relation to tape feeder mounter 5 in a case in which the operator exchanges tape feeder 4 which is mounted on tape feeder mounter 5 for a different tape feeder 4.

Next, description will be given of the configuration of feeder exchanging carriage 10, with reference to FIGS. 2 and 3. Hereinafter, in feeder exchanging carriage 10, the side which is mounted to tape feeder mounter 5 is the front side, the opposite side from the front side is the rear side, right and left as viewed from the rear side are the right side and the left side, respectively.

Figure 2:
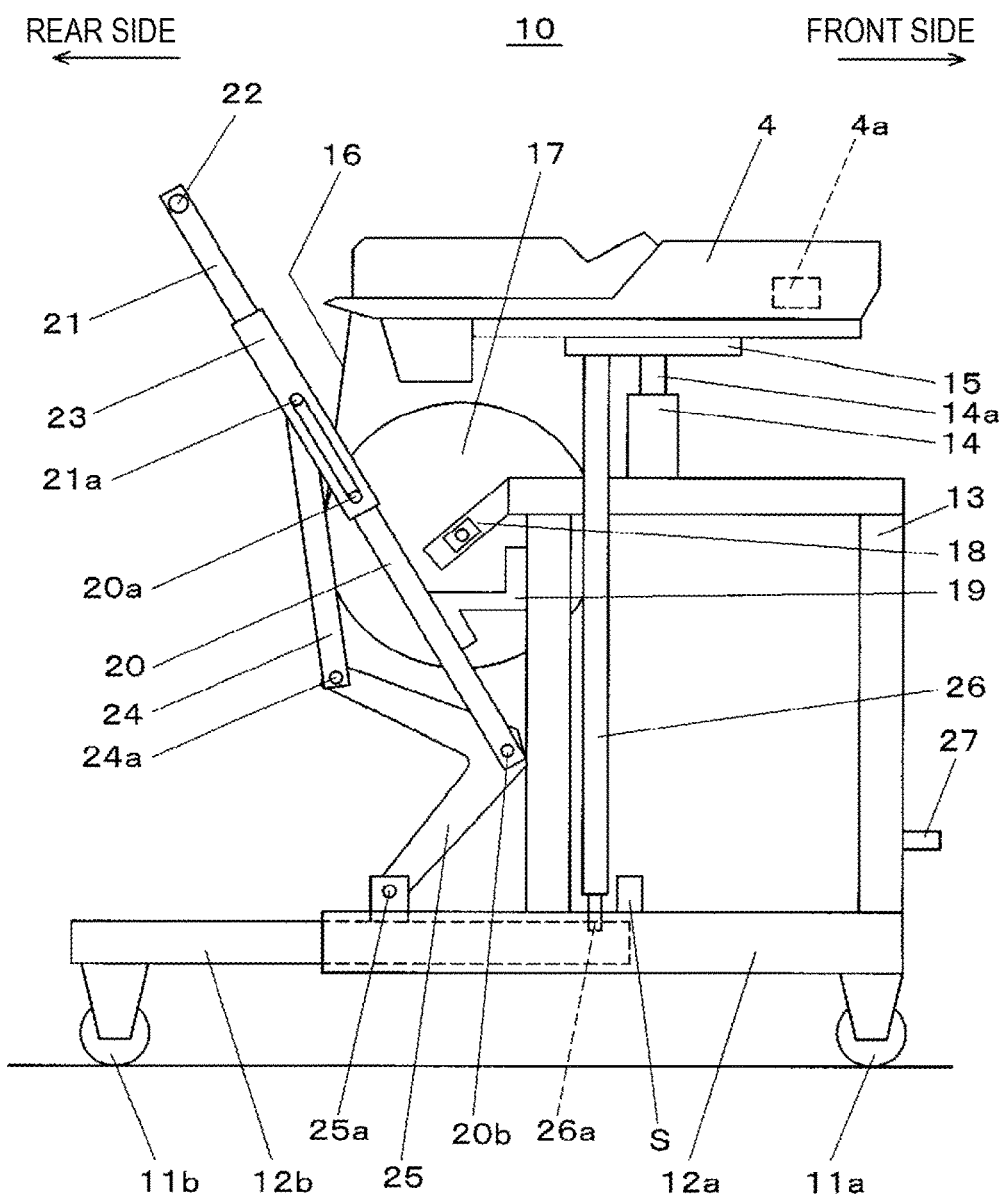
FIG. 2 is a configuration explanation diagram of a feeder exchanging carriage of an exemplary embodiment of the disclosure.
Figure 3:
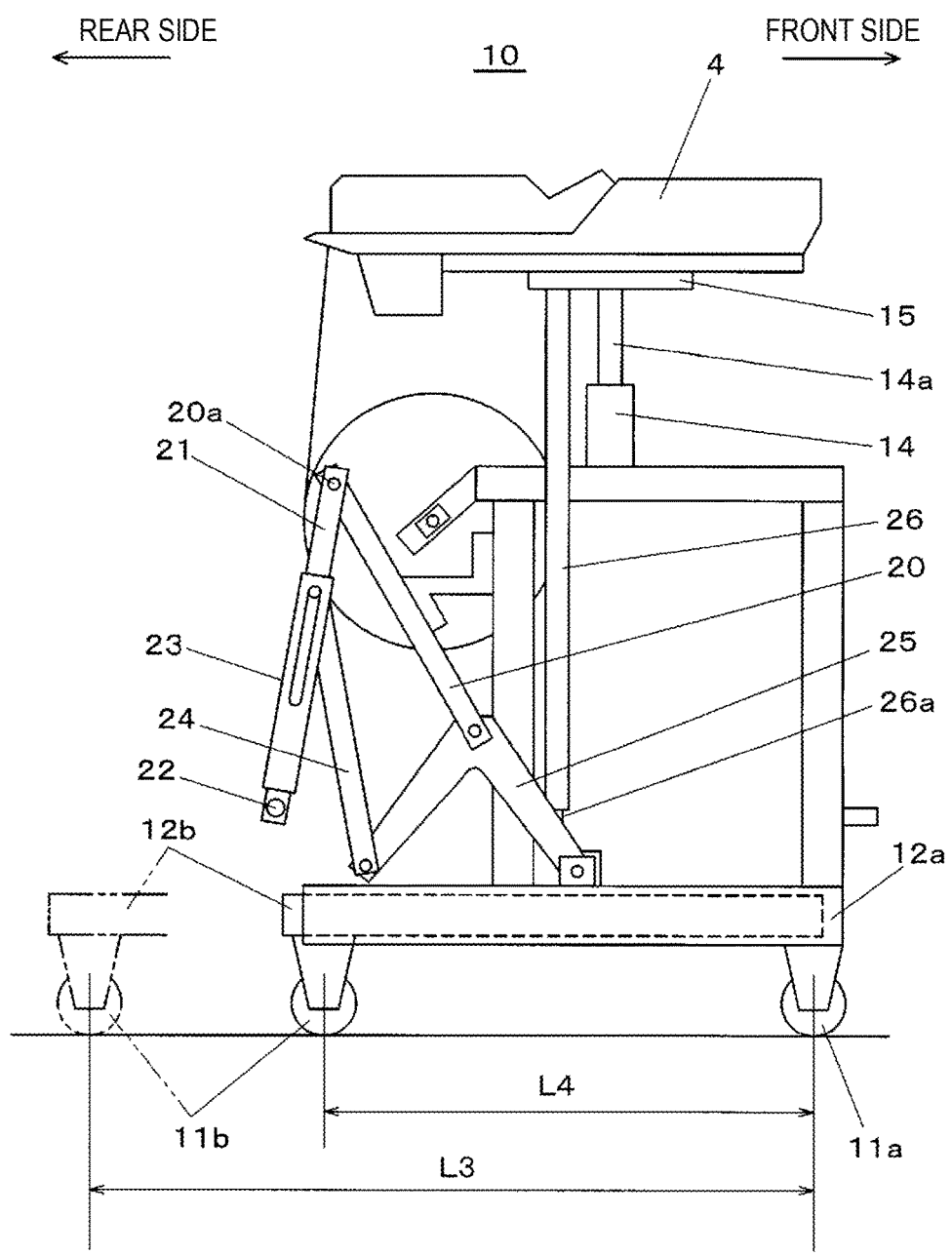
FIG. 3 is an explanatory diagram of a state in which a handle unit of the feeder exchanging carriage of an exemplary embodiment of the disclosure is folded up.

In FIG. 2, feeder exchanging carriage 10 is configured to include front base 12a and rear base 12b. A left-right pair of front wheels 11a is provided under front base 12a, and a left-right pair of rear wheels 11b is provided under rear base 12b, which is capable of sliding forward and backward along front base 12a. When rear base 12b is caused to slide to the rear side along front base 12a, the interval between front wheels 11a and rear wheels 11b expands, and when rear base 12b is caused to slide to the front side along front base 12a, the interval between front wheels 11a and rear wheels 11b is contracted. In other words, front base 12a and rear base 12b form a telescopic unit capable of expanding and contracting the interval between the pair of front wheels 11a and the pair of rear base 11b.

In FIG. 2, support table 13 is installed on front base 12a. Slide bush 14 is installed on the top surface of support table 13. Slide bush 14 supports shaft 14a such that shaft 14a is capable of sliding in a vertical direction, and supports feeder holder 15, which is connected to the top end of slide bush 14a, such that feeder holder 15 may be lifted and lowered freely. In other words, slide bush 14 and shaft 14a form a lifting and lowering unit which supports feeder holder 15 such that feeder holder 15 may be lifted and lowered freely in relation to front base 12a. When carriage pulling mechanism 5b (described later) pulls feeder holder 15 up to a component supplying height at which electronic components are supplied in electronic component mounter 2, shaft 14a follows feeder holder 15 and is pulled upward. When carriage pulling mechanism 5b which holds feeder holder 15 moves downward, feeder holder 15 is lowered to a transporting height.

A plurality of tape feeders 4 are lined up and mounted on the top surface of feeder holder 15. Tape feeder 4 sequentially supplies electronic components by feeding carrier tape 16 which stores the electronic components forward to the front side. In other words, feeder holder 15 holds tape feeders 4 which perform a feeding operation of carrier tape 16. Reel holder 18 which holds reel 17 on which carrier tape 16 is wound is installed on the rear side of the top surface of support table 13. Carrier tape 16 which is pulled out from reel 17 which is held by reel holder 18 is mounted to tape feeder 4 which is held by feeder holder 15. In other words, reel holder 18 holds reel 17 on which carrier tape 16, which stores the electronic components, is wound.

Reel holder 18, feeder holder 15, the pair of front wheels 11a and the pair of rear wheels 11b, front base 12a and rear base 12b (the telescopic unit) constitute a base portion of feeder exchanging carriage 10.

In FIG. 2, a pair of lower handles 20 which extend vertically and are inclined such that the tops thereof are closer to the rear side are fixed and installed above rear base 12b by fixings 19 on the rear side of support table 13. The bottom ends of a pair of upper handles 21 which extend vertically are linked to first rotating shaft 20a which is provided on the top ends of the pair of lower handles 20. Gripping rod 22 which the operator grips when operating feeder exchanging carriage 10 is installed between the top ends of the left and right upper handles 21. Upper handles 21 fold downward using first rotating shaft 20a which is fixed as a fulcrum due to the operator pulling gripping rod 22 downward. In other words, the pair of lower handles 20, the pair of upper handles 21, first rotating shaft 20a, and gripping rod 22 are provided on rear base 12b (rear wheel 11b side of the base unit), and form a collapsible handle unit.

Folding lock member 23 which covers the outer circumference of upper handle 21 and is capable of sliding along upper handle 21 is installed on a portion of upper handle 21. Folding lock member 23 suppresses the folding of upper handle 21 by moving to a locked position at which folding lock member 23 straddles first rotating shaft 20a, which is the fulcrum, to cover a portion of the top of lower handle 20 in a state in which gripping rod 22 is pulled up and upper handle 21 and lower handle 20 form a straight line shape. In other words, folding lock member 23 is a folding lock unit which suppresses the folding operation of the handle unit in a state in which the handle unit is pulled up. When folding lock member 23 is moved to a position which is higher than an unlocking position which is higher than first rotating shaft 20a, upper handle 21 enters the collapsible state (refer also to FIG. 3).

In FIG. 2, the top ends of a pair of linking rods 24 which extend vertically are linked to second rotating shaft 21a which is provided in a predetermined position in the middle of upper handles 21. Linking rods 24 rock forward and backward centered on second rotating shaft 21a. The peak portion of mountain-shaped rocking member 25 is linked to third rotating shaft 20b which is provided on the bottom end of the fixed lower handle 20. Rocking member 25 rocks forward and backward centered on third rotating shaft 20b. A bottom portion of the rear side of rocking member 25 is linked to fourth rotating shaft 24a which is provided on the bottom end of linking rod 24. The bottom portion of the front side of rocking member 25 is linked to fifth rotating shaft 25a which is provided at a predetermined position above rear base 12b.

In the state illustrated in FIG. 2 in which upper handle 21 is pulled up (hereinafter referred to as the "transport state"), linking rod 24 moves upward to lift the rear side of rocking member 25 upward and the front side of rocking member 25 moves to the rear side, and thus, rear base 12b moves to the rear side, and the interval between front wheel 11a and rear wheel 11b is expanded to length L3 (refer to FIG. 3). In the state illustrated in FIG. 3 in which upper handle 21 is folded (hereinafter referred to as the "storage state"), linking rod 24 moves downward to push the rear side of rocking member 25 downward and the front side of rocking member 25 moves to the front side, and thus, rear base 12b moves to the front side, and the interval between front wheel 11a and rear wheel 11b is contracted to length L4.

In other words, linking rod 24 and rocking member 25 engage the handle unit (upper handles 21 and lower handles 20) and the telescopic unit (rear base 12b), and form a linking unit which transmits the movement caused by the folding operation and the lifting operation of the handle unit to the telescopic unit. The interval between front wheels 11a and rear wheels 11b is contracted to length L4 by the folding operation of the handle unit (upper handles 21), and the interval between front wheels 11a and rear wheels 11b is expanded to length L3 by the lifting operation of the handle unit (upper handles 21).

In FIG. 2, locking rod 26 is installed on feeder holder 15. Locker 26a of the bottom end of locking rod 26 extends downward to reach rear base 12b and follows feeder holder 15 to be lifted or lowered. When feeder holder 15 is lowered to the transporting height in the transport state of feeder exchanging carriage 10, that is, in a state in which the interval between front wheels 11a and rear wheels 11b is expanded to length L3, locker 26a engages with rear base 12b to suppress the front-rear sliding of rear base 12b in relation to front base 12a (the state of FIG. 2). When feeder holder 15 is lifted to the supplying height in this state, locker 26a is released to allow the front-rear sliding of rear base 12b in relation to front base 12a (the state of FIG. 3).

In other words, locking rod 26 which is provided with locker 26a is connected to feeder holder 15, and forms a locking member which allows the expansion of the telescopic unit (front base 12a and rear base 12b) in a state in which feeder holder 15 is lifted, and suppresses the expansion of the telescopic unit in a state in which feeder holder 15 is lowered. The locking member (locking rod 26) forms a sliding lock unit which suppresses the contraction of the telescopic unit (front base 12a and rear base 12b).

In FIG. 2, sensor S is installed on front base 12a. Sensor S detects that the telescopic unit (front base 12a and rear base 12b) expands and the interval between front wheels 11a and rear wheels 11b is length L3 (the transport state). Sensor S is a transmittance type laser sensor which detects the front end of rear base 12b, and is set such that the light is blocked by rear base 12b when the interval between front wheels 11a and rear wheels 11b is shorter than length L3, and the light is transmitted when the interval between front wheels 11a and rear wheels 11b is length L3. In this manner, sensor S detects the state in which the telescopic unit is expanded. Sensor S is not limited to this mode, and as long as it is possible to detect that the interval between front wheels 11a and rear wheels 11b is in a state of being expanded to length L3, sensor S may be formed of a reflection type laser sensor, a micro switch, or the like, for example.

In FIG. 2, carriage-side connector 27 is installed in the front side of support table 13 in a position corresponding to device-side connector 5a (refer to FIG. 4A) which is provided on tape feeder mounter 5 of electronic component mounter 2. In a state in which feeder exchanging carriage 10 is mounted to tape feeder mounter 5, device-side connector 5a is connected to carriage-side connector 27, and the power and air which are supplied from electronic component mounter 2 are connected to feeder exchanging carriage 10. Sensor S and feeder controller 4a with which tape feeder 4 is provided are connected to device controller 6 of electronic component mounter 2. Accordingly, it becomes possible to supply air to the air actuator of feeder exchanging carriage 10, and the detection results of sensor S are transmitted to device controller 6.

Figure 4A:
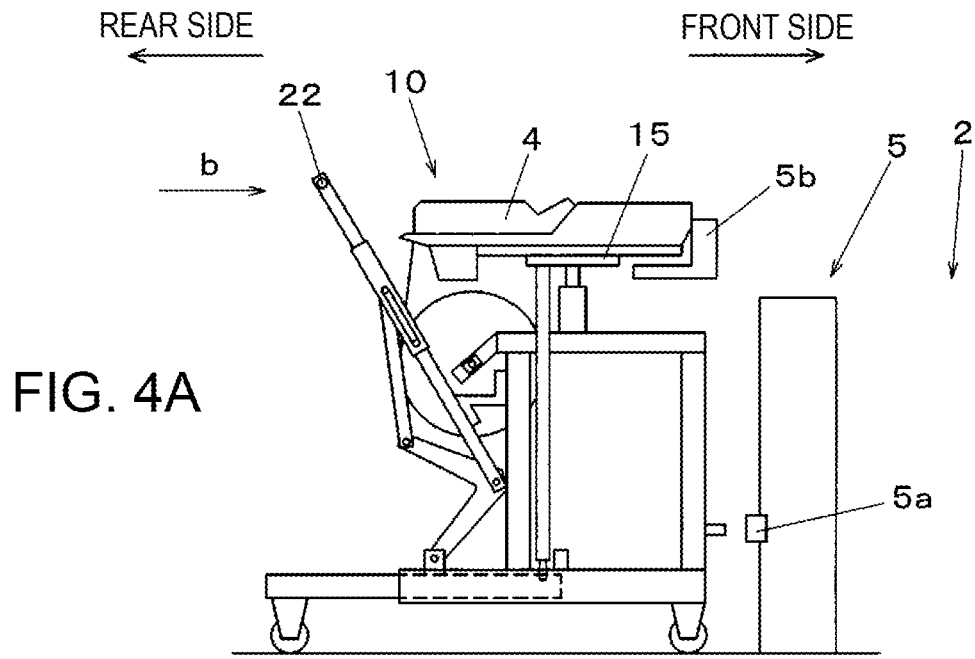
FIGS. 4A and 4B are process explanation diagrams in which the feeder exchanging carriage of an exemplary embodiment of the disclosure is mounted to an electronic component mounter, where

Next, description will be given, in order, of the process of mounting feeder exchanging carriage 10 to tape feeder mounter 5 of electronic component mounter 2 with reference to FIGS. 4A to 5B. First, as illustrated in FIG. 4A, the operator grips gripping rod 22 of feeder exchanging carriage 10 in the transport state to cause feeder exchanging carriage 10 to approach tape feeder mounter 5 from the front side (arrow b), and causes the front end of tape feeder 4 which is held by feeder holder 15 to come into contact with carriage pulling mechanism 5b with which tape feeder mounter 5 is provided.

Figure 4B:
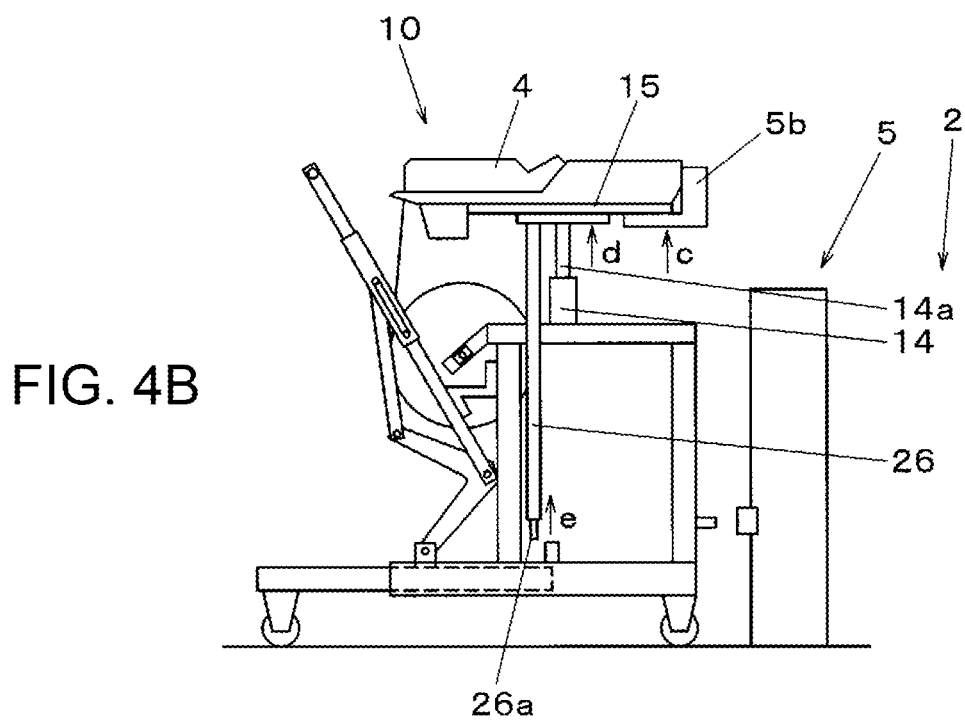

Next, as illustrated in FIG. 4B, when the operator gives a carriage pulling instruction to electronic component mounter 2, device controller 6 controls carriage pulling mechanism 5b, and feeder holder 15 is lifted up together with the mounted tape feeder 4 (arrow c). Shaft 14a is lifted up from slide bush 14 in accordance with the lifting of feeder holder 15 (arrow d), and locking rod 26 is lifted. When feeder holder 15 is lifted to the component supplying height, the engagement between locker 26a and rear base 12b is released (arrow e). A configuration may be adopted in which a contact sensor which detects that feeder holder 15 comes into contact with carriage pulling mechanism 5b is installed, and device controller 6 starts the carriage pulling operation when the contact sensor detects the contact of feeder holder 15.

Figure 5A:
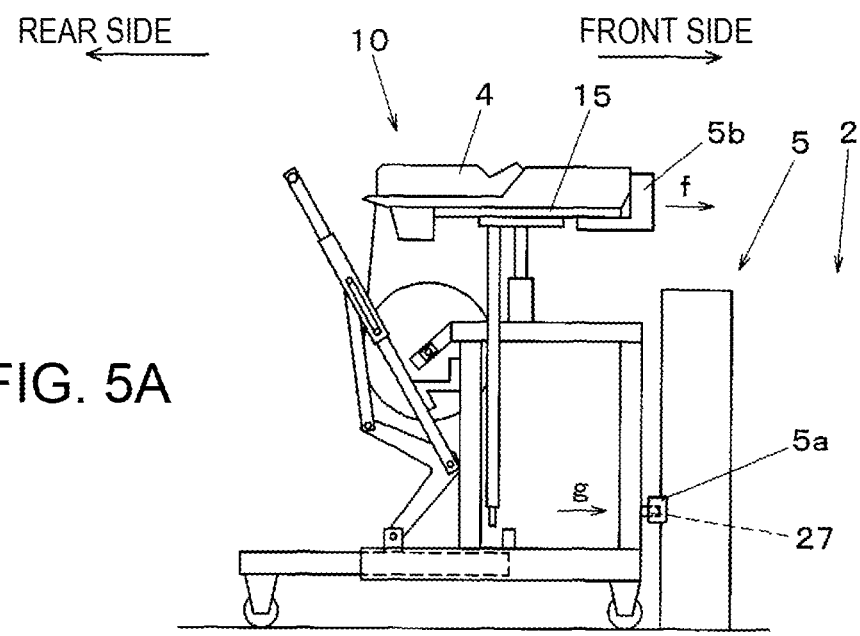
FIGS. 5A and 5B are process explanation diagrams in which the feeder exchanging carriage of an exemplary embodiment of the disclosure is mounted to the electronic component mounter, where
Figure 5B:
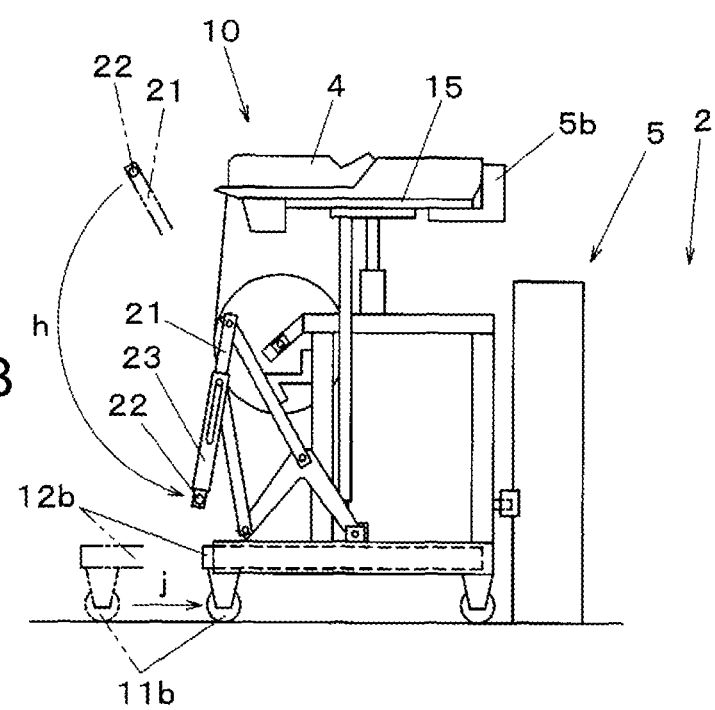

Next, as illustrated in FIG. 5A, carriage pulling mechanism 5b pulls feeder exchanging carriage 10 to tape feeder mounter 5 while lifting up feeder holder 15. In this process, carriage-side connector 27 is connected to device-side connector 5a (arrow g) and the mounting of feeder exchanging carriage 10 to tape feeder mounter 5 is completed. Next, as illustrated in FIG. 5B, the operator moves folding lock member 23 higher than the unlocking position to release the locking of upper handle 21, and grips gripping rod 22 to fold up upper handle 21 (arrow h). In this process, rear base 12b slides to the front side (arrow j), the telescopic unit is contracted, and feeder exchanging carriage 10 enters the storage state. Accordingly, a state is assumed in which it is possible to supply the electronic components from tape feeder 4 to electronic component mounter 2.

Figure 6A:
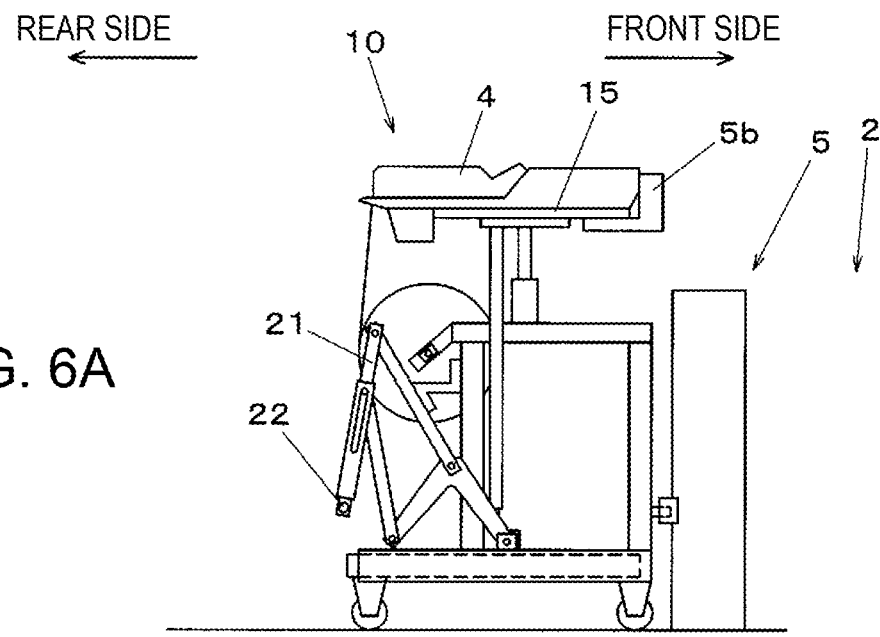
FIGS. 6A and 6B are process explanation diagrams in which the feeder exchanging carriage of an exemplary embodiment of the disclosure is removed from the electronic component mounter, where
Figure 6B:
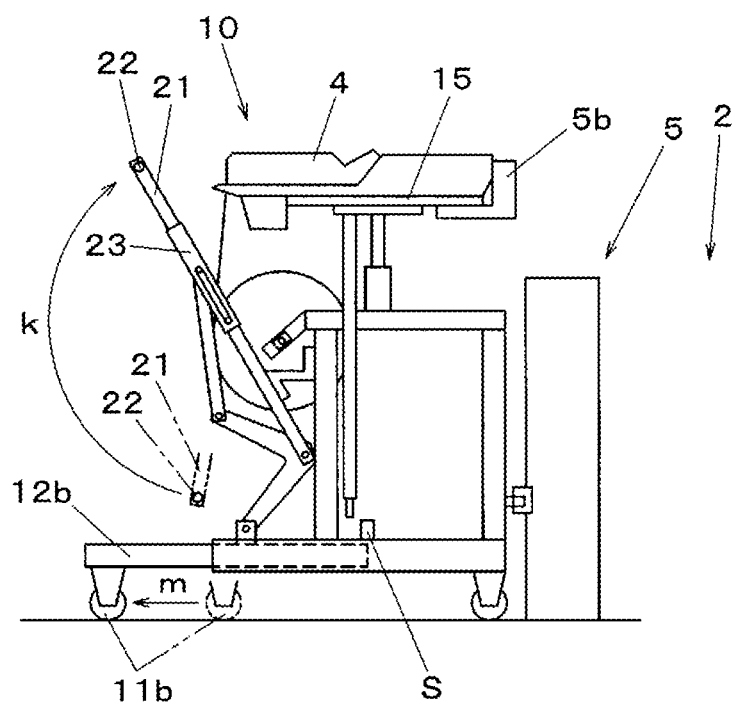

Next, description will be given, in order, of the process of removing feeder exchanging carriage 10 from tape feeder mounter 5 of electronic component mounter 2 with reference to FIGS. 6A to 7B. As illustrated in FIG. 6A, in a state in which feeder exchanging carriage 10 is mounted to tape feeder mounter 5 and tape feeder 4 is supplying the electronic components to electronic component mounter 2, feeder exchanging carriage 10 enters the storage state in which the telescopic unit is contracted. From this state, as illustrated in FIG. 6B, the operator grips gripping rod 22 to pull up upper handle 21 (arrow k), and pulls folding lock member 23 down to the locked position to lock upper handle 21. In this process, rear base 12b slides to the rear side (arrow m), the telescopic unit is expanded, feeder exchanging carriage 10 enters the transport state, and the detection of the transport state is transmitted from sensor S to device controller 6.

Figure 7A:
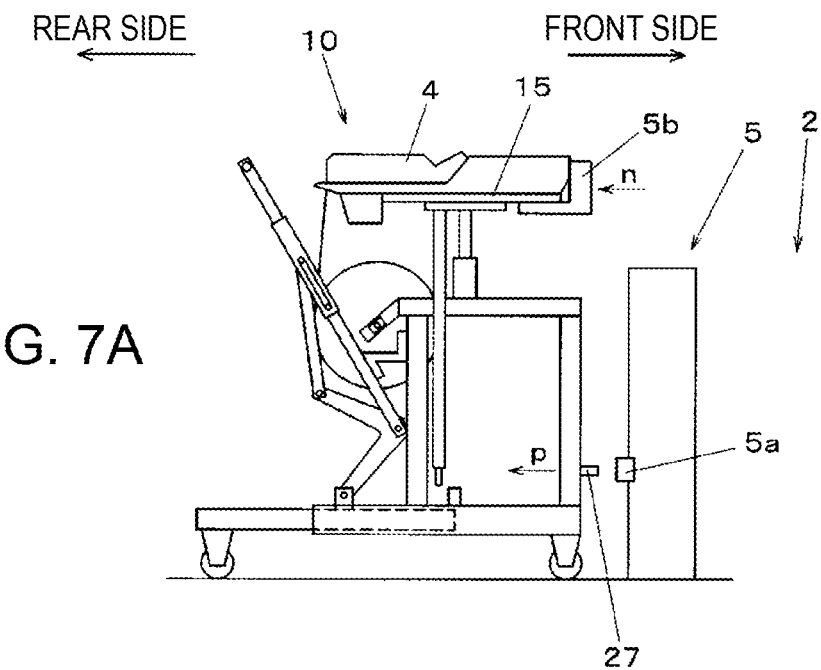
FIGS. 7A and 7B are process explanation diagrams in which the feeder exchanging carriage of an exemplary embodiment of the disclosure is removed from the electronic component mounter, where
Figure 7B:
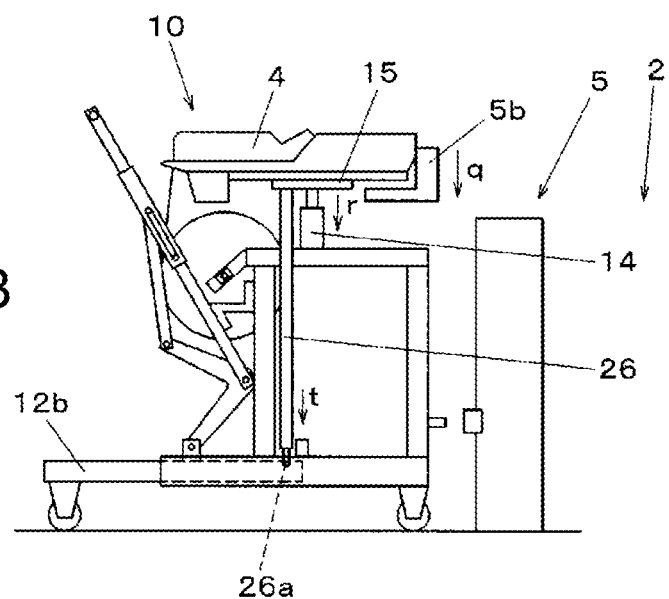

Next, as illustrated in FIG. 7A, when the operator gives a carriage pushing instruction to electronic component mounter 2, device controller 6 controls carriage pulling mechanism 5b to push feeder exchanging carriage 10 out to the rear side (arrow n). In this process, the connection between carriage-side connector 27 and device-side connector 5a is released (arrow p). Next, as illustrated in FIG. 7B, device controller 6 lowers carriage pulling mechanism 5b (arrow q). In this process, feeder holder 15 is lowered to the transporting height (arrow r), locking rod 26 is lowered and locker 26a is engaged with rear base 12b (arrow t), and the sliding of rear base 12b is locked such that the expansion and contraction of the telescopic unit is suppressed. Accordingly, feeder exchanging carriage 10 enters a transportable state.

In this manner, in the storage state in which feeder exchanging carriage 10 is mounted to electronic component mounter 2, the interval between front wheels 11a and rear wheels 11b is contracted by the telescopic unit (front base 12a and rear base 12b), and in the transport state in which feeder exchanging carriage 10 is not mounted to electronic component mounter 2, the interval between front wheels 11a and rear wheels 11b is expanded by the telescopic unit. In a state in which feeder exchanging carriage 10 is not mounted to electronic component mounter 2, the contracting of the interval between front wheels 11a and rear wheels 11b is suppressed by the sliding lock unit (locking rod 26). When sensor S detects the transport state in which the telescopic unit is expanded, carriage pulling mechanism 5b which holds feeder holder 15 moves downward, and feeder holder 15 is supported by the lifting and lowering unit (slide bush 14 and shaft 14a) and is lowered.

The pushing operation of feeder exchanging carriage 10 carried out by carriage pulling mechanism 5b illustrated in FIGS. 7A and 7B is executed only in a case in which the detection of the transport state by sensor S is transmitted to device controller 6. In other words, in the case illustrated in FIG. 6B in which the pulling up of upper handle 21 is not performed, and a case in which the pulling up is not complete and rear base 12b does not slide to the predetermined transport state, even if the operator gives a carriage pushing instruction to electronic component mounter 2, device controller 6 does not allow the pushing operation of carriage pulling mechanism a to be executed. Accordingly, it is possible to prevent the removal of feeder exchanging carriage 10 from electronic component mounter 2 if feeder exchanging carriage 10 is not in the transport state.

As described above, since feeder exchanging carriage 10 is moved in the transport state in which the interval between front wheels 11a and rear wheels 11b is expanded to length L3, it is possible to move feeder exchanging carriage 10 in a stable manner, even if feeder exchanging carriage 10 is removed from electronic component mounter 2. Since the supply of the electronic components from tape feeders 4 is performed in the storage state in which the interval between front wheels 11a and rear wheels 11b is contracted to length L4 after feeder exchanging carriage 10 is mounted to electronic component mounter 2, it is possible to shrink inter-row distance L1 between mounting lines 3 illustrated in FIG. 1. Accordingly, the installation area efficiency of electronic component mounter 2 is improved.

As described above, feeder exchanging carriage 10 of the exemplary embodiment includes reel holder 18, feeder holder 15, and a base unit which is provided with the pair of front wheels 11a and the pair of rear wheels 11b, and the telescopic unit (front base 12a and rear base 12b). Reel holder 18 holds reel 17 on which carrier tape 16 which stores the electronic components is wound, feeder holder 15 holds tape feeder 4 which performs a feeding operation of carrier tape 16, and the telescopic unit renders it possible to expand and contract the interval between the pair of front wheels 11a and the pair of rear wheels 11b. In a state in which feeder exchanging carriage 10 is mounted to electronic component mounter 2, the interval between front wheels 11a and rear wheels 11b is contracted by the telescopic unit, and in a state in which feeder exchanging carriage 10 is not mounted to electronic component mounter 2, the interval between front wheels 11a and rear wheels 11b is expanded by the telescopic unit.

As described above, feeder exchanging carriage 10 of the exemplary embodiment includes reel holder 18, feeder holder 15, a base unit, and a sliding lock unit (locking rod 26). The base unit is provided with the pair of front wheels 11a and the pair of rear wheels 11b, and the telescopic unit (front base 12a and rear base 12b), and the sliding lock unit suppresses the contracting of the telescopic unit. Reel holder 18 holds reel 17 on which carrier tape 16 which stores the electronic components is wound, feeder holder 15 holds tape feeder 4 which performs a feeding operation of carrier tape 16, and the telescopic unit renders it possible to expand and contract the interval between the pair of front wheels 11a and the pair of rear wheels 11b. In a state in which feeder exchanging carriage 10 is mounted to electronic component mounter 2, the interval between front wheels 11a and rear wheels 11b is contracted by the telescopic unit, and in a state in which feeder exchanging carriage 10 is not mounted to electronic component mounter 2, the interval between front wheels 11a and rear wheels 11b is expanded by the telescopic unit, and the contracting of the interval between front wheels 11a and rear wheels 11b is suppressed by the sliding lock unit.

Accordingly, in the transport state in which feeder exchanging carriage 10 is removed from electronic component mounter 2, it is possible to stably move feeder exchanging carriage 10. In the storage state in which feeder exchanging carriage 10 is mounted to electronic component mounter 2, it is possible to improve the installation area efficiency by contracting the interval between front wheels 11a and rear wheels 11b.

A feeder exchanging carriage of the disclosure has an effect of being capable of moving in a stable manner and having excellent installation area efficiency, and is applicable to the component mounting field in which electronic components are mounted to a board.

What is claimed is:

1. A feeder exchanging carriage comprising:
    a reel holder which holds a reel on which a carrier tape which stores electronic components is wound;
    a feeder holder which holds a tape feeder which performs a feeding operation of the carrier tape;
    a base unit provided with a pair of front wheels, a pair of rear wheels, and a telescopic unit which is capable of expanding and contracting an interval between the pair of front wheels and the pair of rear wheels,
    a handle unit which is provided on the rear wheel side of the base unit and is collapsible; and
    a linking unit which engages the handle unit with the telescopic unit and transmits a movement caused by a folding operation and a lifting operation of the handle unit to the telescopic unit,
    wherein in a state in which the feeder exchanging carriage is mounted to an electronic component mounter, the interval is contracted by the telescopic unit,
    wherein in a state in which the feeder exchanging carriage is not mounted to an electronic component mounter, the interval is expanded by the telescopic unit
    wherein the interval is contracted by the folding operation of the handle unit, and
    wherein the interval is expanded by the lifting operation of the handle unit.

2. The feeder exchanging carriage of claim 1, further comprising:
    a folding lock unit which suppresses the folding operation of the handle unit in a state in which the handle unit is pulled up.

3. A feeder exchanging carriage comprising:
    a reel holder which holds a reel on which a carrier tape which stores electronic components is wound;
    a feeder holder which holds a tape feeder which performs a feeding operation of the carrier tape;
    a base unit provided with a pair of front wheels, a pair of rear wheels, and a telescopic unit which is capable of expanding and contracting an interval between the pair of front wheels and the pair of rear wheels;
    a sliding lock unit which suppresses the contraction of the telescopic unit,
    a handle unit which is provided on the rear wheel side of the base unit and is collapsible; and
    a linking unit which engages the handle unit with the telescopic unit and transmits a movement caused by a folding operation and a lifting operation of the handle unit to the telescopic unit
    wherein in a state in which the feeder exchanging carriage is mounted to an electronic component mounter, the interval is contracted by the telescopic unit,
    wherein in a state in which the feeder exchanging carriage is not mounted to an electronic component mounter, the interval is expanded by the telescopic unit and the contraction of the interval is suppressed by the sliding lock unit,
    wherein the interval is contracted by the folding operation of the handle unit, and
    wherein the interval is expanded by the lifting operation of the handle unit.

4. The feeder exchanging carriage of claim 3, further comprising:
    a lifting and lowering unit which supports the feeder holder such that the feeder holder may be lifted and lowered freely in relation to the base unit,
    wherein the sliding lock unit includes a locking member which is connected to the feeder holder, and
    wherein the locking member allows expansion and contraction of the telescopic unit in a state in which the feeder holder is lifted, and suppresses expansion and contraction of the telescopic unit in a state in which the feeder holder is lowered.

5. A feeder exchanging carriage comprising:
    a reel holder which holds a reel on which a carrier tape which stores electronic components is wound;
    a feeder holder which holds a tape feeder which performs a feeding operation of the carrier tape;
    a base unit provided with a pair of front wheels, a pair of rear wheels, and a telescopic unit which is capable of expanding and contracting an interval between the pair of front wheels and the pair of rear wheels;
    a sliding lock unit which suppresses the contraction of the telescopic unit; the feeder exchanging carriage further comprising:
    a lifting and lowering unit which supports the feeder holder such that the feeder holder may be lifted and lowered freely in relation to the base unit,
    wherein in a state in which the feeder exchanging carriage is mounted to an electronic component mounter, the interval is contracted by the telescopic unit,
    wherein in a state in which the feeder exchanging carriage is not mounted to an electronic component mounter, the interval is expanded by the telescopic unit and the contraction of the interval is suppressed by the sliding lock unit,
    wherein the sliding lock unit includes a locking member which is connected to the feeder holder, and
    wherein the locking member allows expansion and contraction of the telescopic unit in a state in which the feeder holder is lifted, and suppresses expansion and contraction of the telescopic unit in a state in which the feeder holder is lowered.

6. The feeder exchanging carriage of claim 5, further comprising:
    a sensor which detects a state in which the telescopic unit is expanded,
    wherein when the state in which the telescopic unit is expanded is detected by the sensor, the feeder holder is supported by the lifting and lowering unit and is lowered.

* * * * *